US006003675A

United States Patent [19]
Maruyama et al.

[11] Patent Number: 6,003,675
[45] Date of Patent: *Dec. 21, 1999

[54] PART RETAINER FOR HOLDING A PART

[75] Inventors: Yoshio Maruyama, Kyoto; Yoshinori Wada, Moriguchi; Shinji Kadoriku, Takarazuka; Osamu Yamazaki, Toyonaka; Osamu Hikita, Hirakata; Daisuke Nagano, Nara, all of Japan

[73] Assignee: Matsushita Electric Industrial Co., Ltd., Japan

[*] Notice: This patent issued on a continued prosecution application filed under 37 CFR 1.53(d), and is subject to the twenty year patent term provisions of 35 U.S.C. 154(a)(2).

[21] Appl. No.: 08/836,361
[22] PCT Filed: Sep. 20, 1996
[86] PCT No.: PCT/JP96/02724
  § 371 Date: May 12, 1997
  § 102(e) Date: May 12, 1997
[87] PCT Pub. No.: WO97/11593
  PCT Pub. Date: Mar. 27, 1997

[30] Foreign Application Priority Data

Sep. 22, 1995 [JP] Japan ................................. 7-244452
Jan. 26, 1996 [JP] Japan ................................. 8-012555

[51] Int. Cl.⁶ ............................................. B65D 85/86
[52] U.S. Cl. ....................... 206/713; 206/714; 206/486; 206/560
[58] Field of Search ............................ 206/713, 714, 206/724, 722, 725, 486, 334, 330, 332, 560

[56] References Cited

U.S. PATENT DOCUMENTS

| 4,547,794 | 10/1985 | Tang . |
| 4,681,221 | 7/1987 | Chickanosky et al. ............... 206/328 |
| 4,696,526 | 9/1987 | Newton et al. . |
| 5,028,985 | 7/1991 | Matsuoka . |
| 5,045,923 | 9/1991 | Matsuoka . |
| 5,066,245 | 11/1991 | Walker . |
| 5,080,228 | 1/1992 | Maston, III et al. . |
| 5,349,236 | 9/1994 | Oshino et al. . |
| 5,526,936 | 6/1996 | Matsuzoe . |
| 5,769,236 | 6/1998 | Maruyama et al. .................. 206/714 |

FOREIGN PATENT DOCUMENTS 0660655  6/1995  European Pat. Off. .

*Primary Examiner*—Paul T. Sewell
*Assistant Examiner*—John Preta
*Attorney, Agent, or Firm*—Parkhurst & Wendel, L.L.P.

[57] ABSTRACT

The present invention is a part retainer for housing and retaining various electronic and mechanical parts wherein a retaining unit has an engaging piece that stably stops at both a position at which it protrudes toward the opening of a part housing space and a position at which it withdraws, and which can move between these two positions under a specified or more amount of force, and wherein when protruding toward the opening, the engaging piece prevents the part housed in the housing space from falling out.

32 Claims, 23 Drawing Sheets

(a)

(b)

(c)

PART RETAINER FOR HOLDING A PART

FIELD OF THE INVENTION

The present invention relates to a part retainer for housing and retaining various electronic and mechanical parts and a method for manufacturing this retainer, as well as a part supply apparatus for supplying parts housed in the part retainer to an automatic assembly machine.

BACKGROUND ART

Conventional part retainers for retaining and loading a collection of a large number of parts in a part supply apparatus include retaining tapes with a large number of housing recesses formed at a specified interval. After housing parts in the housing recesses, such part retainers cover the top surface thereof with cover tapes to prevent the parts from falling out.

Such part retainers, however, require parts to be covered with cover tapes during housing and the tapes to be released and wound during part supply, thereby requiring a part supply apparatus of a complicated configuration. In addition, the release tapes must be used, thereby increasing costs.

As a device that solves this problem, the applicant proposed in JPA 6-156562, a part retainer 31 comprising a connected retaining units 32 each having a housing recess 33 in which a part is housed and an engaging piece 34 disposed in the opening for preventing the part from falling out, as shown in FIG. 13. The engaging piece 34 has a protrusion 36 protruding therefrom, is disposed at the end of a supporting piece 35 integrally extending from the sidewall of the retaining unit 32, and protrudes into the opening of the housing recess 33. Since the protrusion 36 on the top surface of the engaging piece 34 engages a guide groove (not shown) formed in a guide rail through which the part retainer 31 travels, the engaging piece 34 is guided by the guide groove to move toward a withdrawing position as the part retainer 31 moves, thereby enabling the part to be housed in and removed from the housing recess 33. Reference numeral 37 designates a feed hole formed in either side of the retaining unit 32, and 38 is a connecting piece for connecting retaining units 32 together.

In the part retainer disclosed in the above publication, however, if the engaging piece 34 remains at the withdrawing position for a long time, a creep phenomenon may cause the supporting piece 35 to remain deformed and to be prevented from elastic return. Thus, the engaging piece 34 cannot reliably retain parts.

In addition, since the engaging piece 34 protrudes into the housing recess 33, a notch opposite to the engaging piece 34 must be formed during molding of the retaining unit 32, and the part cannot be engaged or retained in its full circumference. Consequently, some parts cannot be stably retained.

Furthermore, conventional part supply apparatuses for supplying parts to an electronic part mounting machine have a structure in which the travelling surface for the part retainer is completely covered near a part removal position, as shown in FIG. 25. Thus, if in particular, due to the switching of product types, the part retainer is removed from the part supply apparatus before all the housed parts have been used up, the tape must be cut before or after the part removal section and rewound to a feed or winding reel. If parts are used again, the tape must be connected again, and a large amount of time is required to replace the tape.

DISCLOSURE OF THE INVENTION

In view of the conventional problems, an objective of this invention is to provide a part retainer and its manufacturing method which can stably and reliably retain parts in their full circumference as well as a part supply apparatus for which the part retainer is used.

According to this invention, a part retainer of the present invention comprises connected retaining units for housing and retaining parts, and the retaining unit has an engaging piece that stably stops at both a position at which it protrudes toward the opening of the part housing space and a position at which it withdraws, and which can move between these two points under a specified or more amount of force. When protruding toward the opening, the engaging piece prevents the part housed in the housing space from falling out.

The above configuration enables the engaging piece protruding into the opening to hold the part housed in the part housing space. In addition, by moving the engaging piece to the withdrawing position, the part can be removed. Even if the engaging piece remains at the withdrawing position for a long time, it can be reliably moved to the protruding position to reliably retain the part. After supplying the housed part to the automatic assembly machine, the retainer can be reused by housing parts therein again.

To enable the engaging piece to stably stop at the position at which it protrudes toward the opening and the position at which it withdraws and to move between these two positions, each of the opposed sidewalls of the retaining unit and each end of the engaging piece are connected together by a pair of link pieces via a self hinge. This allows either side of the engaging piece to be supported by the quadric link mechanism, so the engaging piece is stable at the two positions and can stably move between the two positions with its attitude maintained.

Even if each of the sidewalls of the retaining unit and each of the sides of the engaging piece are connected via a single link piece, the engaging piece is stable at the two positions and can stably move between these positions. Either end of the pair of link pieces hinge-connected together may be connected to either of the opposed or adjacent sidewalls of the retaining unit, with the engaging piece disposed in one of the link pieces. Either end of a curved supporting piece may also be connected to either of the opposed or adjacent end walls of the retaining unit via a self hinge, with the engaging piece disposed at the approximate center of the curved supporting piece. The more simple configurations described above can produce effects almost similar to those of the first embodiment.

In addition, by providing a protrusion located above or below the engaging piece for moving the engaging piece between the two positions through a guide groove or protrusion disposed along the travelling passage of the part retainer and leading to a part housing or removal position, the engaging piece can be moved between the two positions as the part retainer moves. In particular, when the protrusion is disposed below the engaging piece, the guide groove can be located on the same side as a feed mechanism of the part retainer to reduce the dimensional error between the guide groove and the feed mechanism, thereby improving the reliability of moving the engaging piece.

The engaging piece may be disposed at one or both ends of the retaining unit, or in one or more corners thereof. Disposing the engaging piece in corners enables dead space to be efficiently used and reduces the movement of the engaging piece, if corners of the part have protrusions such as leads.

In addition, by disposing connecting holes in one side of the retaining unit in the connection direction while disposing on the other side thereof in the connection direction engaging protrusions that fit and engage the engaging holes, and providing on the engaging protrusion an engagingly locking means that engages the circumference of the connecting hole to prevent the protrusion from being removed, simply fitting the engaging protrusions in the connecting holes enables retaining units to be connected so as not to be separated easily or inadvertently.

The method for manufacturing part retainers according to this invention comprises using a molding machine to mold a retaining unit, moving the molded retaining unit to a position at which a previously molded retaining unit has been placed, fitting in the connecting holes in one side of one retaining unit in the connection direction the engaging protrusions on the other side of the other retaining unit to connect the retaining units, and sequentially transferring the connected retaining units a distance corresponding to a single retaining unit. According to this method, retaining units are molded and sequentially connected to improve the productivity of part retainers.

Since the retaining unit is molded in such a way that the engaging piece withdraws from the opening of the part housing space, a retaining frame that retains the full circumference of the part can be formed in the part housing space in order to provide a part retainer capable of stably holding parts. While the retainer units are being sequentially transferred, after having been connected each other, each engaging piece is moved to the protruding position at which it protrudes toward the opening of the part housing space, and the resin hinge at the connection is moved immediately after the molding, whereby the strength of the engaging piece is increased, and the retainer can be reliably used over a long period of time.

A part supply apparatus according to this invention comprises a part supply apparatus body that can be installed in and removed from an automatic assembly machine, a feed reel section that is disposed at one end of the part supply apparatus body and around which a tape-like part retainer is wound, a part removal position that is formed at the other end of the part supply apparatus body and at which parts are removed from the part retainer, a winding reel section that is disposed at one end of the part supply apparatus body and around which the part retainer is rewound after parts have been removed at the part removal section, a tape feed means for moving the part retainer drawn out from the feed reel section to a specified part removal position and allowing it to be wound by the winding reel section, and a tape guide for pressing the part retainer against the other end of the part supply apparatus body, wherein eliminating the pressure of the tape guide enables the part retainer to be removed from the side of the apparatus with the connections in the part retainer maintained.

The above constitution enables the part retainer to be installed in and removed from the side of the part supply apparatus while remaining connected from the feed reel to the winding reel. The part supply apparatus according to this invention enables the tape-like part retainer in use to be replaced without cutting it, thereby significantly reducing the time required for replacement.

Furthermore, by including a one-way clutch in which the winding reel section can rotate only in the winding direction, the winding reel is prevented from rotating in the opposite direction, thereby enabling the tape-like part retainer be stably transferred.

BEST MODE FOR CARRYING OUT THE INVENTION

One embodiment of a part retainer according to this invention is described with reference to FIGS. 1 to 9.

Figure 1:
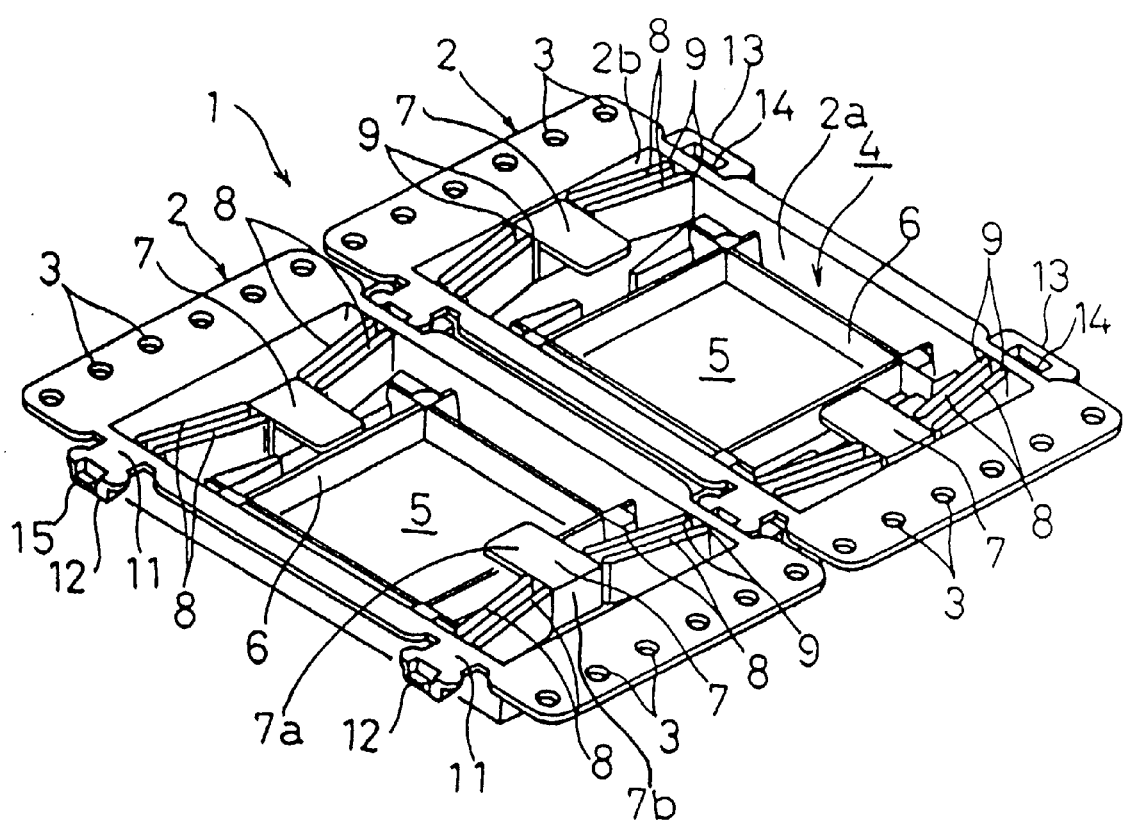
FIG. 1 is a perspective view showing a part retainer according to a first embodiment of this invention.
Figure 2:
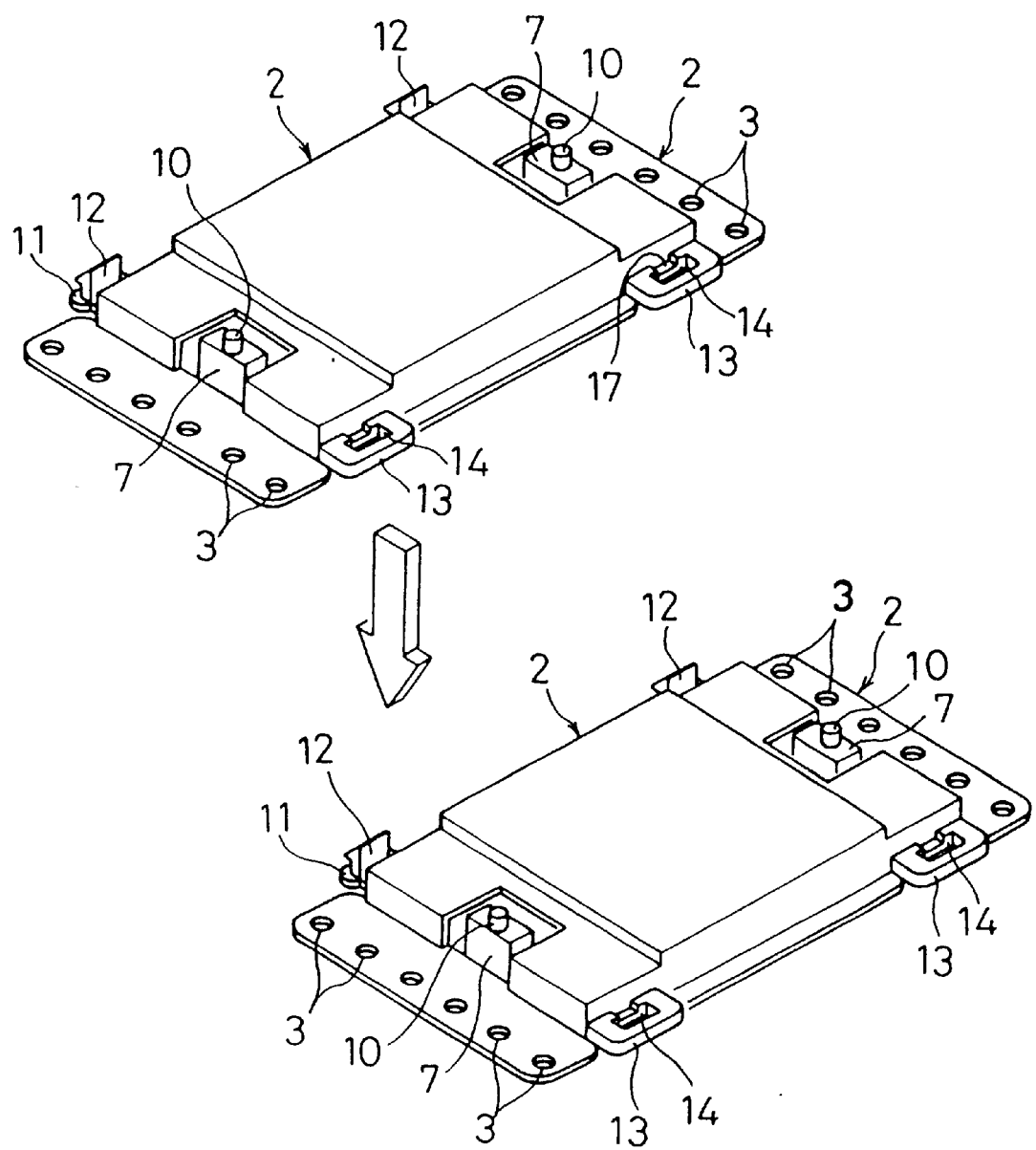
FIG. 2 is a perspective view showing a connecting operation for retaining units according to the first embodiment.

In FIGS. 1 and 2, 1 is a part retainer comprising a large number of retaining units 2 (only two are illustrated). Each retaining unit houses and retains a part to constitute a tape-like collection of parts, The retaining unit 2 is manufactured by injection molding polypropylene or polyethylene, has a generally rectangular planar shape that is long in the direction perpendicular to the connection direction, and has feed holes 3 formed at a specified pitch on either side in the connection direction. The retaining unit 2 has a shallow recess 4, except in its circumferential portion, and the middle of the recess 4 is used as a space 5 for housing a part. The housing space 5 is surrounded by a square upright retaining frame 6 that retains the four corners of a part.

An engaging piece 7 that can move between a position at which it protrudes into the opening above the housing space 5, and a position at which it withdraws from the opening, is disposed on either side of the housing space 5. When in the protruding position, the engaging piece 7 holds the top surface of a part housed in the housing space 5 to prevent it from falling out, whereas in the withdrawing position, it enables a part to be housed in or removed from the housing space 5. In FIG. 1, in the retaining unit 2 located diagonally upward, the engaging piece 7 is in the withdrawing position, whereas in the retaining unit 2 located diagonally downward, the engaging piece 7 is in the protruding position. This is also applicable to FIGS. 10 to 12. The engaging piece 7 includes a generally horizontallly extending section 7a connected to a generally vertically extending section 7b.

The engaging piece 7 is connected via a pair of link pieces 8 to either sidewall 2a disposed in the connection direction of the retaining units 2. Each link piece 8 has a length somewhat longer than half the length obtained by subtracting the width of the engaging piece 7 from the distance between the sidewalls 2a, 2a. The connection between the link piece 8 and the sidewall 2a and between the link piece 8 and the engaging piece 7 are made using thin self hinges 9. This enables the engaging piece 7 to be stable at the two positions, that is, the protruding and withdrawing positions, and to move between the two positions under a specified force, as described above. The engaging piece 7 has on its bottom surface protrusions 10 with which the engaging piece 7 can be moved between the two positions.

Figure 3:
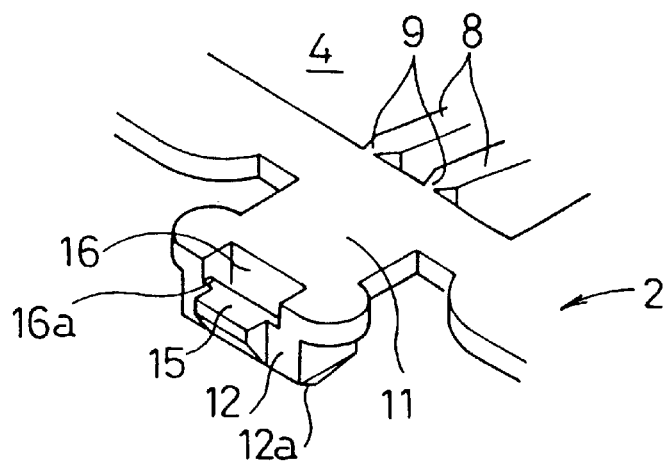
FIG. 3 is an enlarged perspective view of an engaging protrusion of the retaining unit according to-the first embodiment.

A pair of connecting pieces 11 each having an engaging protrusion 12 protruding downward therefrom is disposed at an appropriate interval at one edge of the retaining unit 2 in the connection direction. A pair of protrusions 13 each having a connecting hole 14 engaging the engaging protrusion 12 are disposed at the other edge in the connection direction at the positions corresponding to the connecting holes 11. The engaging protrusion 12 has a sharp protrusion 12a formed at its bottom end and an engagingly locking means 15 protruding from its one side, as shown in FIG. 3 in detail. The engagingly locking means 15 has inside a recess 16 of a width larger than that of the claw, and both ends of the engagingly locking means 15 and the sidewall of the recess 16 are connected by a thin connecting wall 16a. Thus, when fitted in the connecting hole 14 under an appropriate amount of external force, the engagingly locking means 15 is ensured to return to its original state. An engaged surface 17 is formed around the connecting hole 14 and engages the engagingly locking means 15 when the engaging protrusion 12 is completely fitted in the connecting hole 14.

Figure 4:
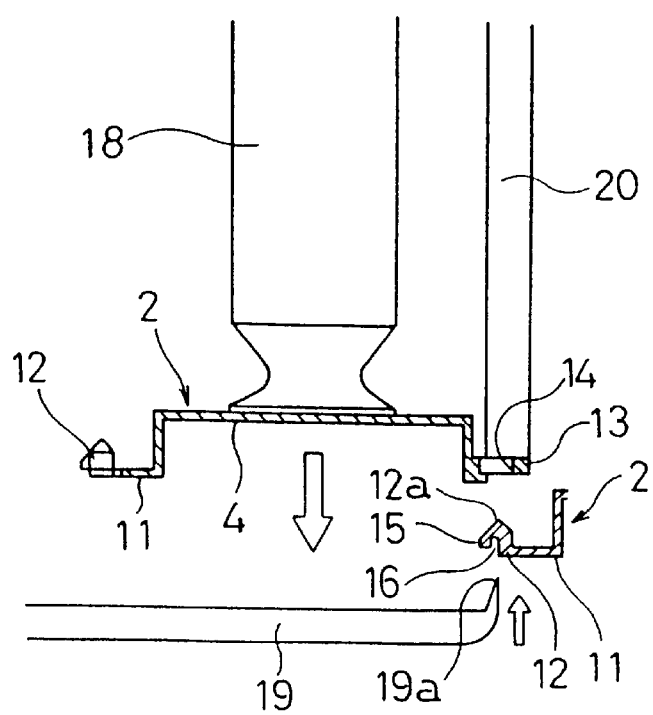
FIG. 4 is a partial cross sectional view showing a connecting operation for retaining units according to the first embodiment.
Figure 5:
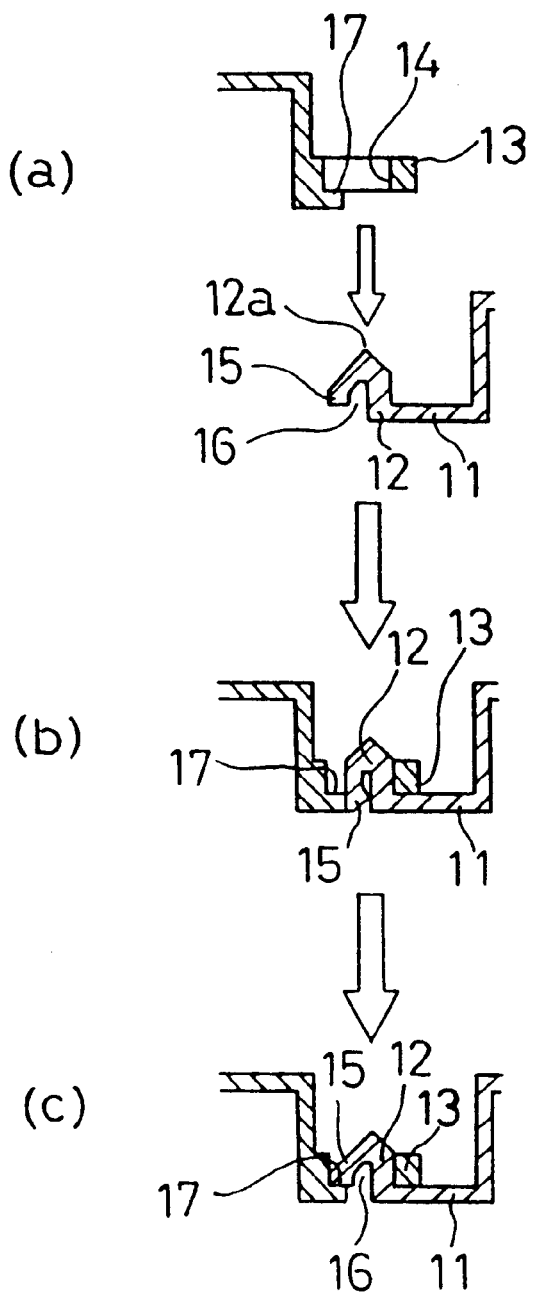
FIGS. 5(a)–(c) are cross sectional view showing a process for fitting the engaging protrusion in the connecting hole during connection of the retaining units according to the first embodiment.
Figure 6:
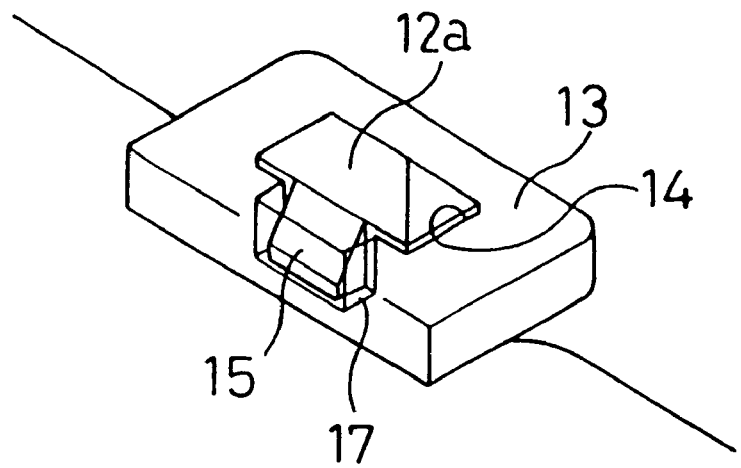
FIG. 6 is a perspective view showing the connecting section of the retaining unit with the engaging protrusion fitted in the connection hole according to the first embodiment.

To connect retaining units 2 together, one retaining unit 2 is supported upward while the other is supported downward by a suction means 18 with its connecting hole 14 located above the engagingly locking protrusion 12 of the first retaining unit 2, as shown in FIG. 4, and the second retaining unit 2 is lowered as shown by the arrow in the figure. Then, as shown in FIGS. 5(a) to (c), the engaging protrusion 12 is contracted and fitted in the connecting hole 14, and the engagingly locking means 15 withdraws toward the recess 16, returns, and engages the engaged surface 17 formed on one side of the connecting hole 14. The unit is then in the state shown in FIG. 6, thereby preventing the engaging protrusion 12 from being removed from the connecting hole 14 and ensuring that the retaining units 2 are connected together.

The engaging protrusion 12 can be reliably fitted in the connecting hole 14 because the needle-like end of a supporting member 19 is inserted into the recess 16 of the engaging protrusion 12 to support the protrusion 12 from downward and because a pressing member 20 presses the protrusion 13 with the connecting hole 14 from upward, as shown in FIG. 4. Thus, if the engaging protrusion 12 includes the engagingly locking means 15, simply fitting the engaging protrusion 12 in the connecting hole 14 enables the retaining units 2 to be connected together so as not be separated easily or inadvertently.

Figure 7:
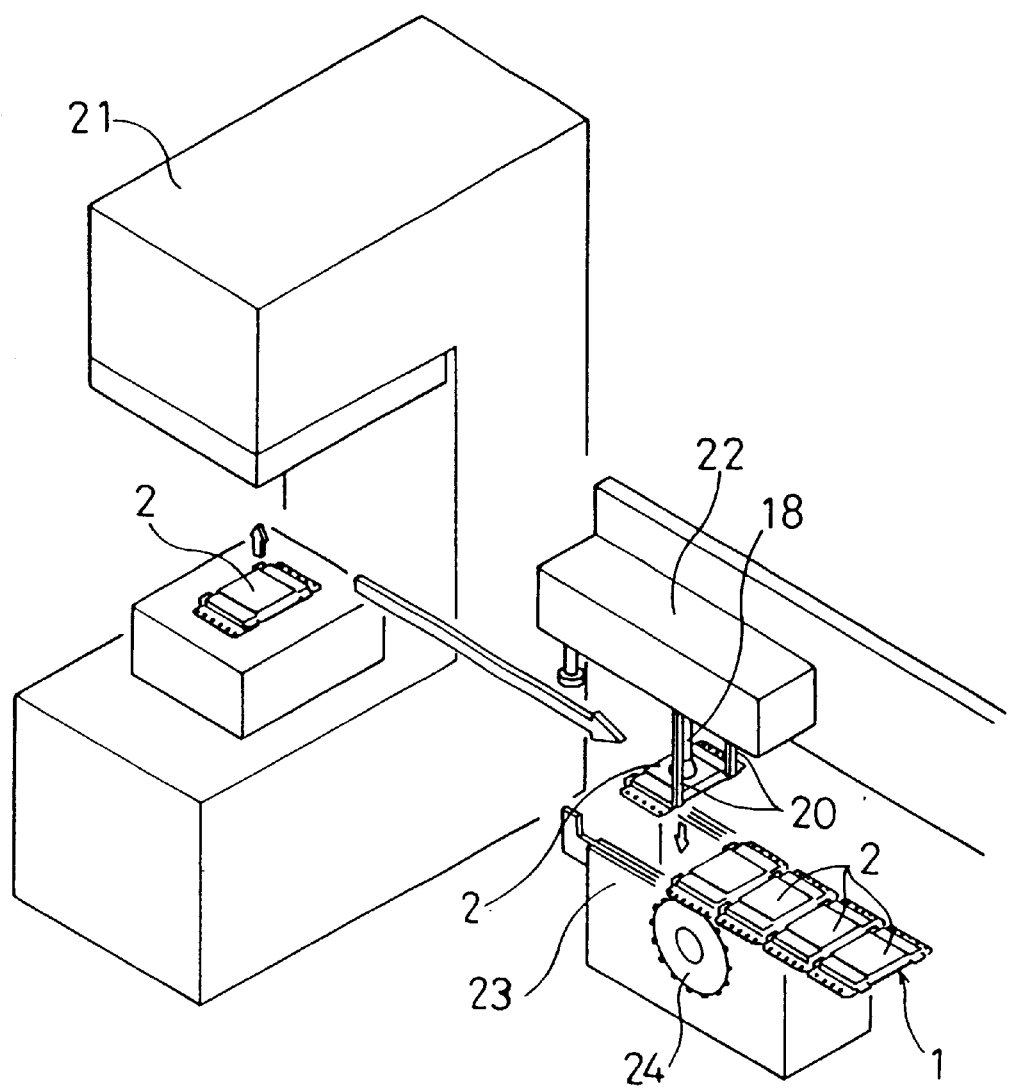
FIG. 7 is a perspective view showing an apparatus for manufacturing part retainers according to this invention.

Next, a part retainer manufacturing apparatus and process is described with reference to FIG. 7. In FIG. 7, 21 is a molding machine for injection-molding a retaining unit 2, and 22 is a transfer and load means for obtaining the molded retaining unit 2 from the molding machine 21 and transferring it to a connecting section 23 and includes the suction means 18. The connecting section 23 is configured so as to receive and support retaining units 2, and has a feed means 24 for sequentially feeding a distance equal to the width of the retaining unit 2, the part retainer 1 comprising retaining units 2 connected using their feed holes 3; the supporting member 19 (see FIG. 4); and the pressing member 20.

The molding machine 21 molds the retaining unit 2, which is then transferred to the connecting section 23 in which a previously molded retaining unit has been placed. The connecting holes 14 in the first retaining unit 2 is then fitted to the engaging protrusions 12 at the corresponding end of the second retaining unit to connect them together as described above. The productivity of the part retainer 1 is improved by repeating the operation of the feed means 24 for feeding the part retainer 1 a distance equal to a single retaining unit.

In this manufacturing process, since during molding of the retaining unit 2, the engaging piece 7 withdraws from the opening in the housing space 5, it does not interfere with the space 5. Consequently, a retaining frame 6 for holding the full circumference of a part can be formed in the housing space 5 to obtain a part retainer 1 that can hold parts stably, as shown in FIG. 1.

In addition, a guide groove (not shown) is disposed in the bottom of the connection section 23, so that the protrusions 10 for moving the engaging piece 7 back and forth are engaged thereto and guided therealong. When the engaging piece 7 is moved to the protruding position toward the opening of the housing space 5 while the connected retaining units 2 are being sequentially transferred, self hinges 9 which have just been molded can be moved in order to improve the strength of the engaging piece, thereby realizing long and reliable use of the part retainer.

Next, housing, retention, and removal of-parts using the part retainer of the above configuration are described with reference to FIGS. 8 and 9. The part housing and retention section or removal section has a guide rail 25 for guiding the part retainer 1 as shown in FIG. 9, and the part retainer 1 moves along the guide rail 25. The guide groove 26 engages the protrusions 10 for moving the engaging piece 7 back and forth is formed in the top surface of the guide rail 25. The guide means for the protrusions 10 need not be configured as the guide groove 26 but may be shaped like a protrusion.

Figure 8:
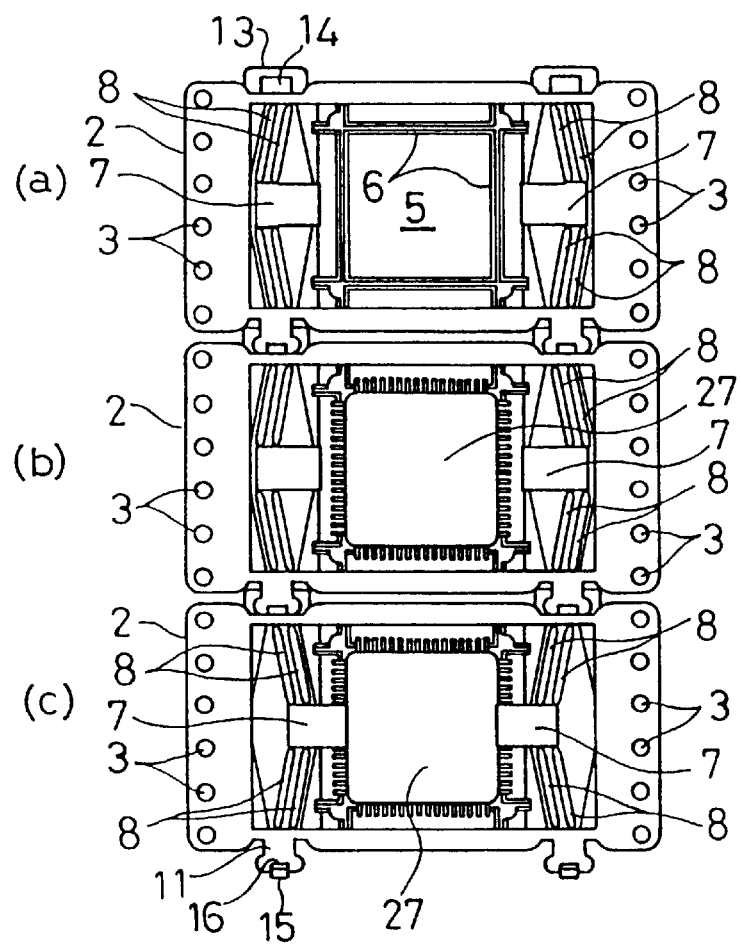
FIG. 8 is a plan view of a process for housing parts in the part retainer according to this invention.
Figure 9:
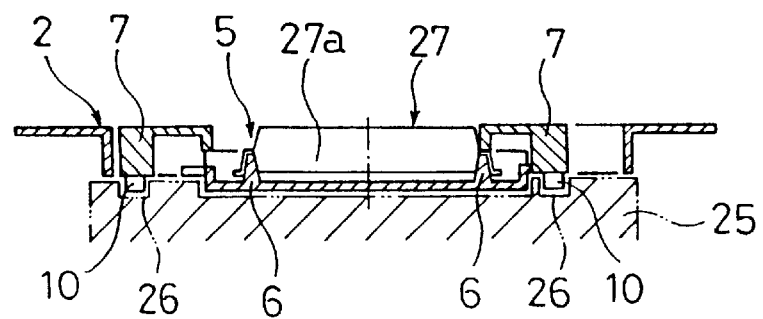
FIG. 9 is a cross sectional view of a process for housing and removing parts from the part retainer according to the first embodiment. The left half is a cross sectional view showing the housing or removal of a part, while the right half is a cross sectional view showing the retention of a part.

If a part 27 is housed and retained in each retaining unit 2 of the part retainer 1, the engaging piece 7 moves to the withdrawing position while each retaining unit 2 is moving toward the housing position, as shown in FIG. 8(*a*), and at the housing position, the part 27 is housed in the housing space 5 as shown in FIG. 8(*b*). While the retaining unit is subsequently moving further from the housing position, the engaging piece 7 moves to the protruding position to prevent the part 27 from falling out and to retain it in the part retainer 2, as shown in FIG. 8(*c*). Repetition of these operations allows the efficient production of a collection of parts with the part 27 held in each retaining unit 2 of the part retainer 1.

If this collection of parts is loaded on the part supply apparatus and the part 27 is removed, the engaging piece 7 moves from the state in FIG. 8(*c*) in which the part 27 is engagingly held to the withdrawing position shown in FIG. 8(*b*) while the retaining unit 2 is moving toward the part removal position, and at the removal position, the part 27 is removed as shown in FIG. 8(*a*).

FIG. 8 illustrates as the part 27 an electronic part (called "QFP") having a large number of leads-around its outer circumference. With the bottom surface of the base of the leads of the QFP 27 supported on the supporting frame 6, the top surface of the base of the leads and the sides of the main body 27*a* are held by the engaging piece 7. Since the QFP 27 is fixed and held with all the leads completely supported by the supporting frame 6, the leads are prevented from being damaged or bent.

As described above, according to the part retainer 1 of this embodiment, the engaging piece 7 is stable at the protruding and withdrawing positions and can move between these two positions, so the part 27 housed in the housing space 5 is retained by the engaging piece 7 protruding into the opening. In addition, the part 27 can be removed by moving the engaging piece 7 to the withdrawing position, and the engaging piece 7 can be reliably moved to the protruding position even after it has remained at the withdrawing position for a long time, thereby enabling the part to be reliably retained. In addition, since the engagement piece 7 and the retaining unit 2 are connected together by the pair of link pairs 8 via the self hinge, each engagement piece 7 is supported by the quadric link mechanism, is stable at the two positions, and can move stably between the two positions while maintaining its attitude, thereby providing stable operations. Furthermore, the strength of the engaging piece 7 is improved to firmly hold the part.

Although the above embodiment connects the pair of link pieces 8 to either side of the engaging piece 7, either of the opposed sidewalls 2*a* of the retaining unit 2 may be connected to either side of the engagement piece 7 by a single link piece 8 via the self hinge 9. This configuration can produce effects similar to those with the pair of link pieces 8 because the protrusion 10 is provided for each engaging piece 7 and because protrusion 10 can be guided along the guide groove 26 to reliably move the engagement piece 7 to the protruding or withdrawing position in order to make the piece 7 stable at that position.

Figure 10:
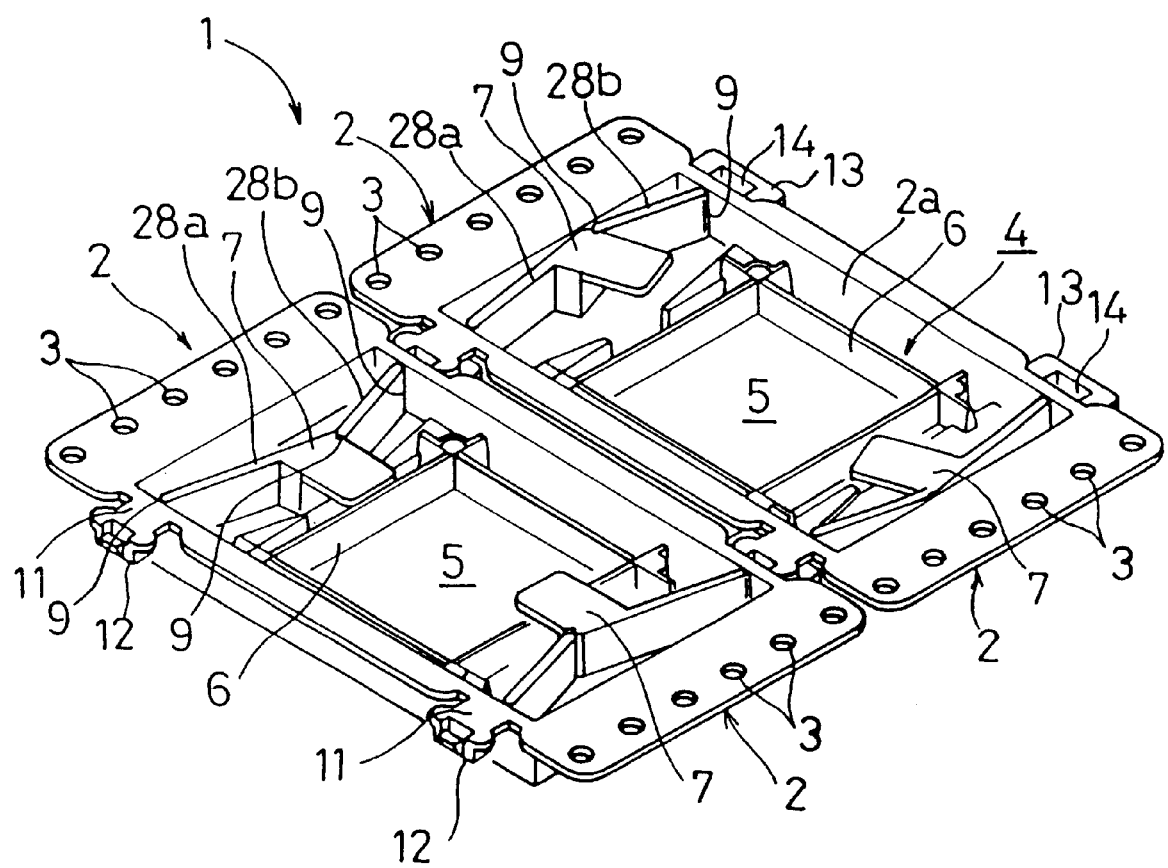
FIG. 10 is a perspective view showing a part retainer according to a second embodiment of this invention.

A second embodiment of the part retainer according to this invention is described with reference to FIG. 10. According to the second embodiment, either end of a pair of link pieces 28*a*, 28*b* connected together by the self hinge 9 is connected to either of the opposed sidewalls 2*a* of the retaining unit 2 by the self hinge 9, with the engaging piece 7 provided on one of the link pieces 28*a*.

In this embodiment, despite a change in the configuration between the protruding position and the withdrawing position, the engaging piece 7 produces effects similar to those of the above embodiment by preventing the part from falling out in the protruding position while enabling the part to be removed from the housing space 5 in the withdrawing position.

A third embodiment of the part retainer according to this invention is described with reference to FIG. 11. According to this embodiment, either end of a flexible curved supporting piece 29 is connected to either of the opposed sidewalls 2*a* of the retaining unit 2 by the self hinge 9, with the engaging piece 7 disposed at the approximate center of the curved supporting piece 29.

According to this embodiment, since the curved supporting piece 29 changes its configuration between a curve toward the housing space 5 and a curve toward the opposite direction to the housing space 5, the engaging piece 7 can move between the protruding position and the withdrawing position and is stable at these two positions-. Thus, effects similar to those of the above embodiments can be obtained by allowing the engaging piece 7 to prevent the part from falling out at the protruding position while enabling it to be removed from the housing space 5 at the withdrawing position.

Figure 12:
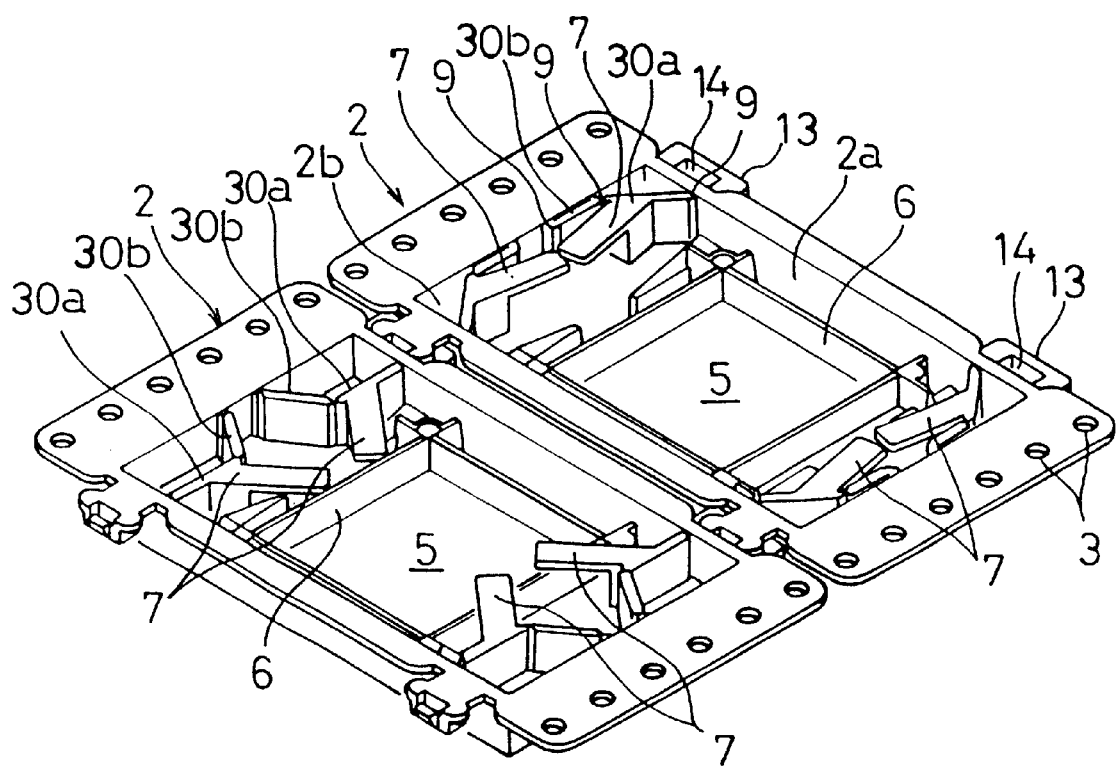
FIG. 12 is a perspective view showing a part retainer according to a fourth embodiment of this invention.
Figure 13:
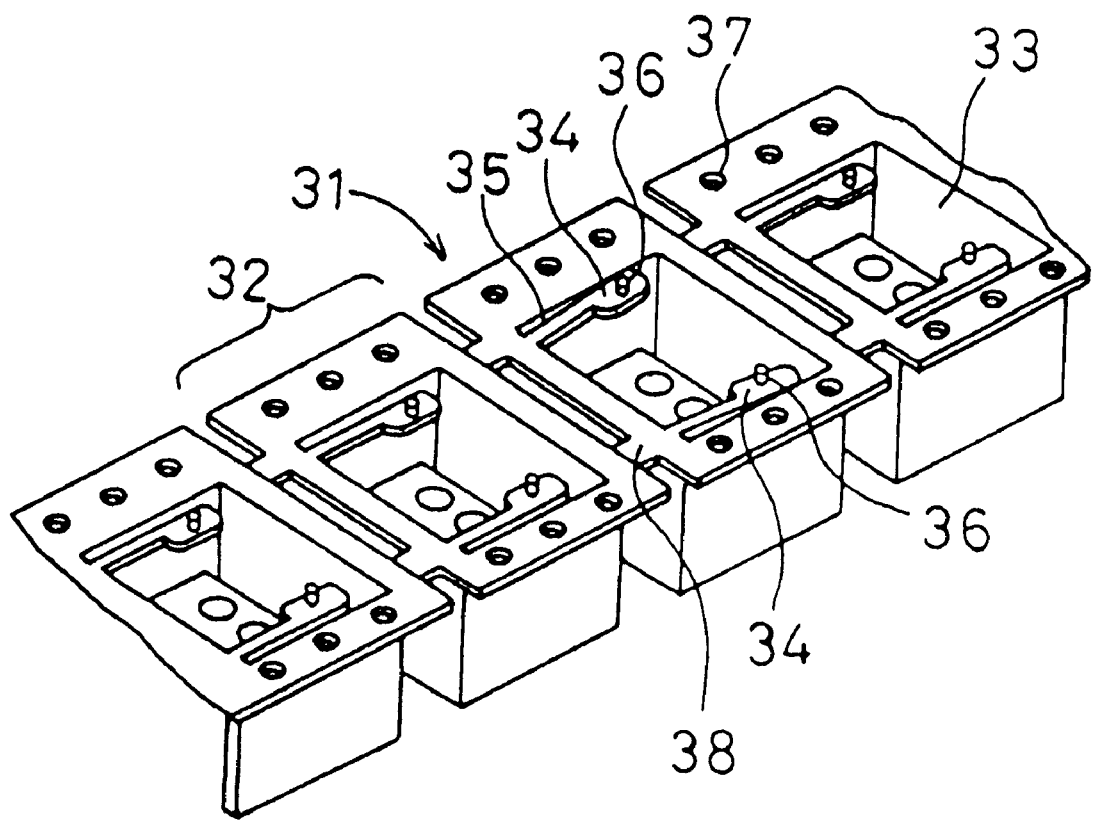
FIG. 13 is a perspective view showing a conventional part retainer.

A fourth embodiment of the part retainer according to this invention is described with reference to FIG. 12. Although the above embodiments have been shown with the engagement piece 7 disposed at either end of the retaining unit 2, the fourth embodiment includes the engaging piece 7 of the same shape as the second embodiment in each corner at either end. In the illustrated embodiment, the ends of link pieces 30*a*, 30*b* are connected to either sidewall 2*a* of the retaining unit 2 and the sidewall 2*b* at either end of the retaining unit 2, respectively, with the engaging piece 7 disposed on one of the link pieces 30*a*.

Figure 11:
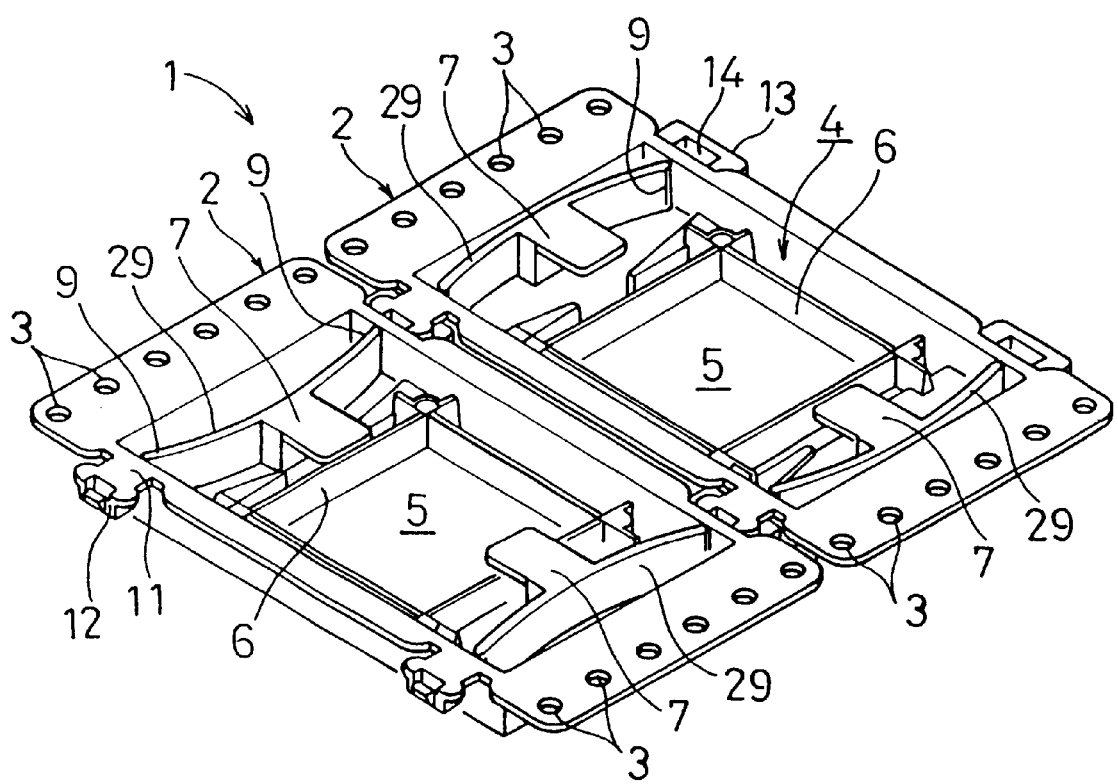
FIG. 11 is a perspective view showing a part retainer according to a third embodiment of this invention.

It will be understood that other mechanisms such as the one shown in FIG. 11 may be used.

By disposing the engaging piece 7 in the corner of the housing space 5, the dead space can be effectively used and no substantial movement of the engaging piece 7 is required. As a result, the engaging piece 7 does not interfere with parts having protrusions such as leads in their four corners.

Although the above embodiments have been shown with the engaging piece 7 disposed at either end or each corner of the housing space 5, the engaging piece 7 may be disposed only at one end or in one or two corners of the housing space 5 and used to hold and fix the part.

Next, an embodiment of a part supply apparatus according to this invention which uses the part retainer is described.

Figure 14:
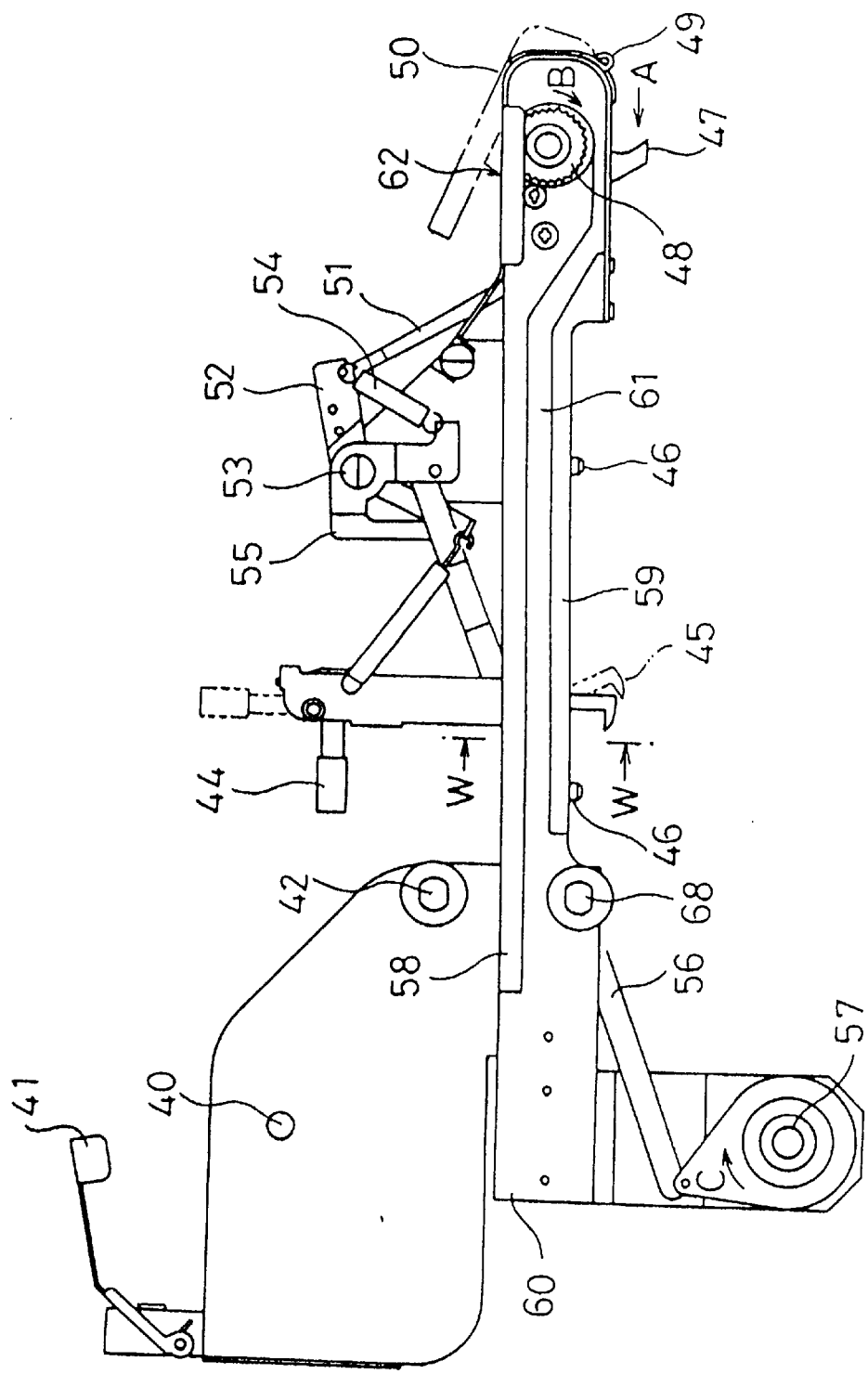
FIG. 14 is a front view of a part supply apparatus according to this invention.
Figure 20:
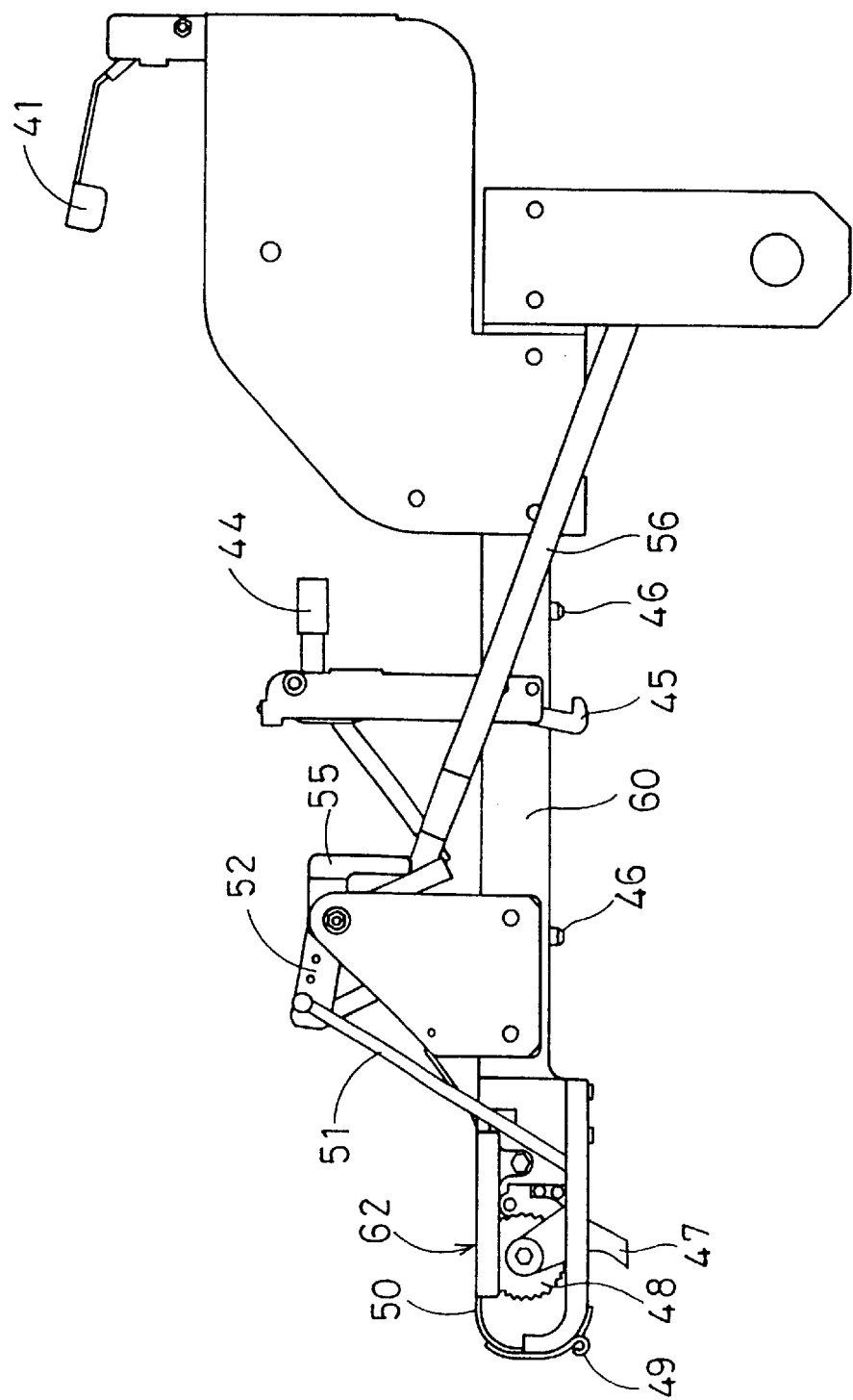
FIG. 20 is a rear view of the part supply apparatus.
Figure 21:
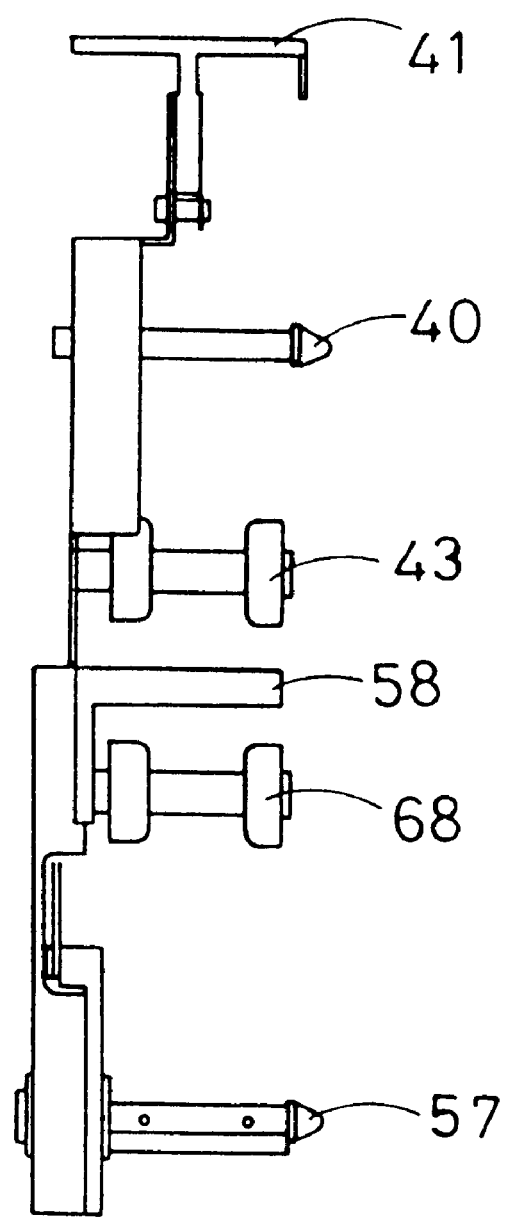
FIG. 21 is a left end view of the part supply apparatus.
Figure 22:
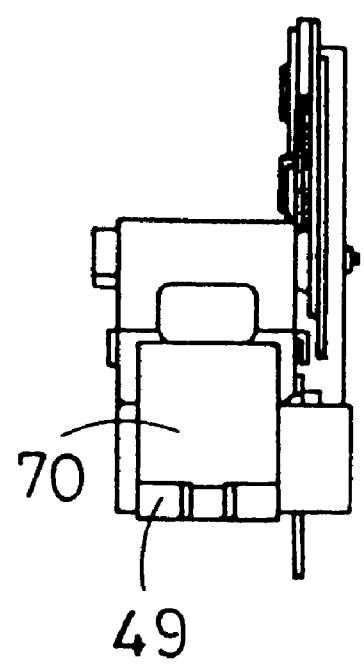
FIG. 22 is a right end view of the part supply apparatus.
Figure 23:
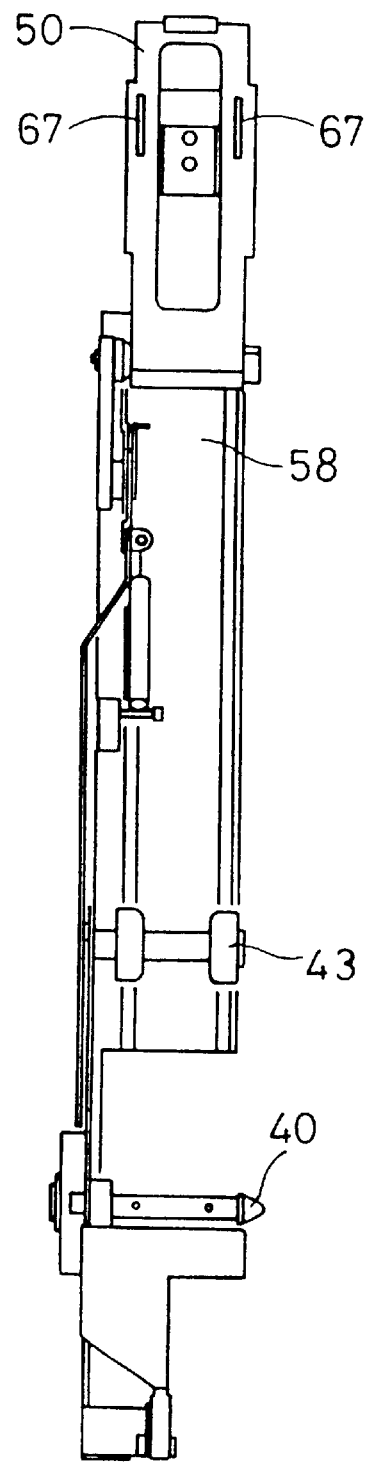
FIG. 23 is a plan view of the part supply apparatus.
Figure 24:
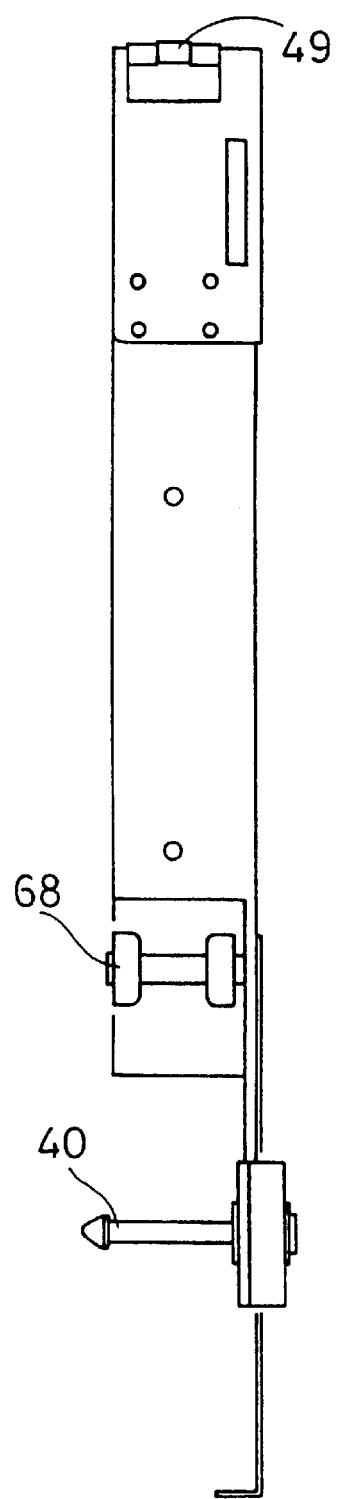
FIG. 24 is a bottom view of the part supply apparatus.
Figure 25:
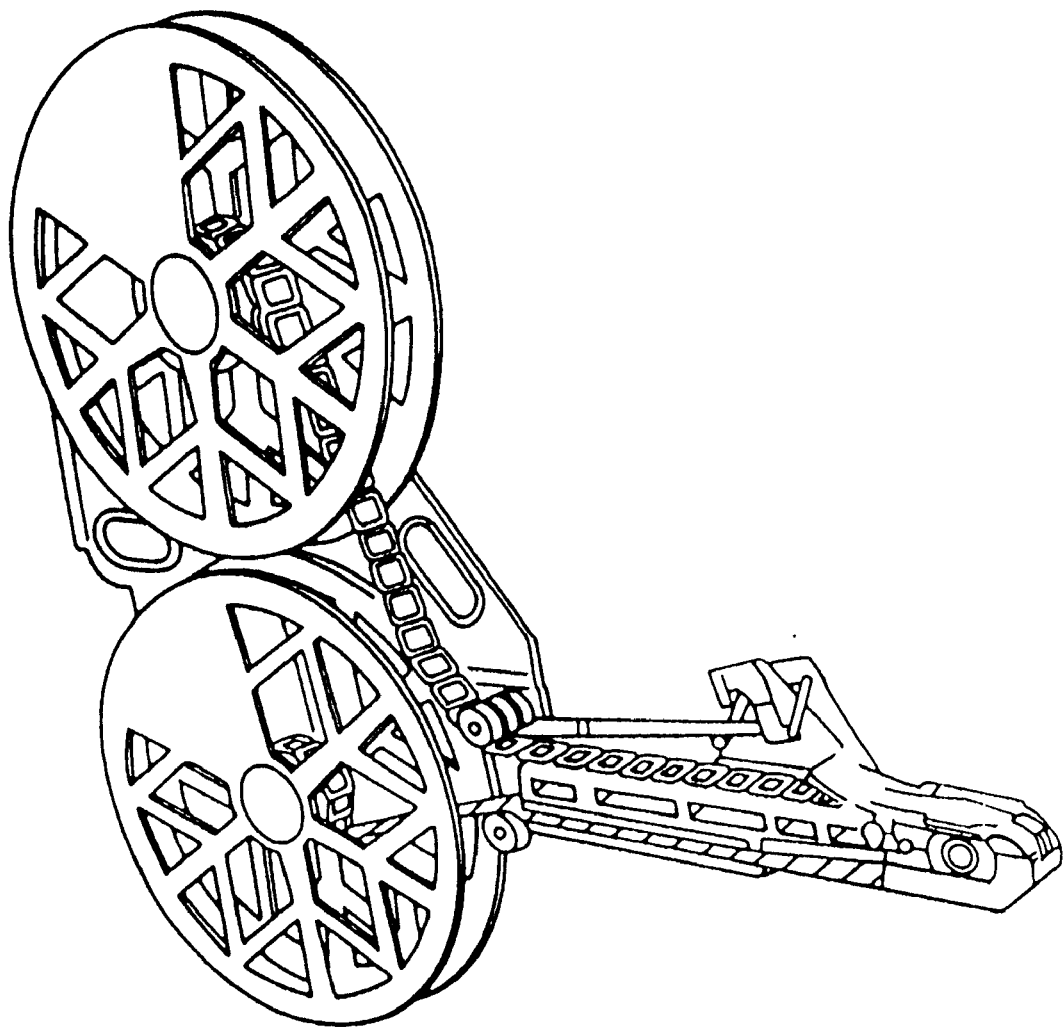
FIG. 25 is a perspective view of a conventional part supply apparatus.

FIG. 14 is a front view of a part supply apparatus according to this invention. FIG. 20 is a rear view, FIG. 21 is a left side view, FIG. 22 is a right side view, FIG. 23 is a plan view, and FIG. 24 is a bottom view.

Figure 17:
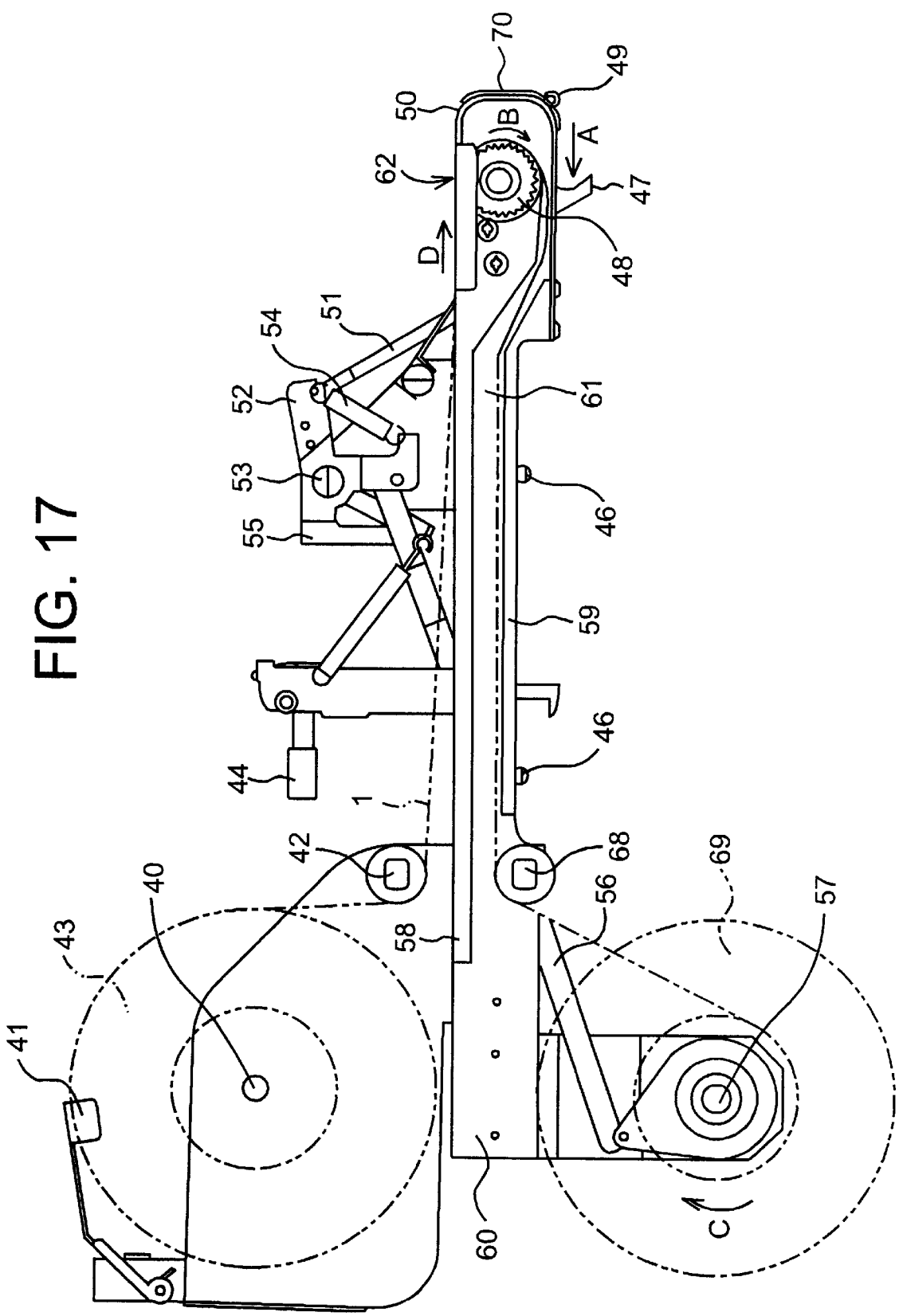
FIG. 17 is a front view showing the part supply apparatus including the part retainer.

In FIG. 14, 40 is a reel retention section rotatably retaining a reel around which the part retainer 1 with parts housed is wound, 41 is a reel presser section for contacting the outer circumference of a reel 43 to regulate the unwanted rotation of the reel 43 as shown in FIG. 17, and 42 is a roller that changes the travelling direction of the tape-like part retainer transferred from the reel 43. These components constitute the feed reel section. Reference numeral 44 designates a clamp lever for operating a clamp 45 to fix the part supply apparatus to the part supply section of an electronics mounting machine (not shown). As the clamp lever 44 is rotated to the position shown by the broken line, the fixing clamp 44 is accordingly moved to the position also shown by the broken line to release the part supply apparatus from the electronics mounting machine. Reference numeral 46 denotes a positioning pin that is fitted in a positioning hole provided in a part supply section of the electronics mounting machine to regulate the mounting position of the part supply apparatus when the part supply apparatus is fixed to the electronics mounting apparatus. Reference numeral 47 is a feed lever. When a specified amount of external force is applied to the feed lever 47 from the direction shown by arrow A, a tape feed means 48 connected to the lever is rotated a specified amount in the direction shown by arrow B. Since the feed holes 3 in the tape-like part retainer 1 engage the gear of the tape feed means 48, the rotation of the tape feed means 48 causes the part retainer 1 to be moved a specified amount. At this point, a tape guide 50 that can rotate around a supporting point 49 applies a downward pressure to fit the gear of the tape feed means 48 in the feed holes 3 of the part retainer 1. The position of the supporting point 49 is not limited to those shown in FIGS. 14 and 17, and other positions may be used as long as the tape guide 50 is rotatably supported.

The rotational force of the tape feed means 48 is transmitted to a lever 52 via a link 51. As the lever 52 rotates around a supporting point 53, the force of a spring 54 activates a lever 55 to cause a link 56 abutting the lever 55 to rotate a winding means 57 a specified amount in the direction shown by arrow C.

Figure 15:
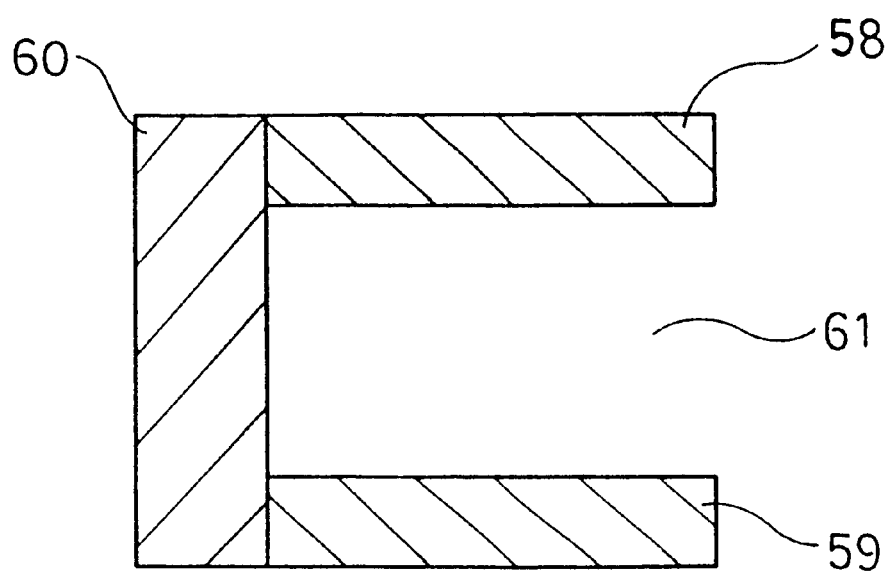
FIG. 15 is a cross sectional view of the part supply apparatus taken across line W—W in FIG. 14.

Reference numeral 58 indicates a tape travelling section that acts as a surface on which the tape-like part retainer 1 travels, and 59 is a base section the bottom surface of which is mounted on the electronics mounting machine. As shown in FIG. 15, the tape travelling section 58 and the base section 59 are each mounted on the part supply apparatus body 60 from its side. These components 58, 59, and 60, however, need not be separate members, but may be formed as an integral member. According to this embodiment, the above constitution serves to form a groove-like tape travelling space that enables the tape to be replaced from the side of the apparatus.

Figure 16:
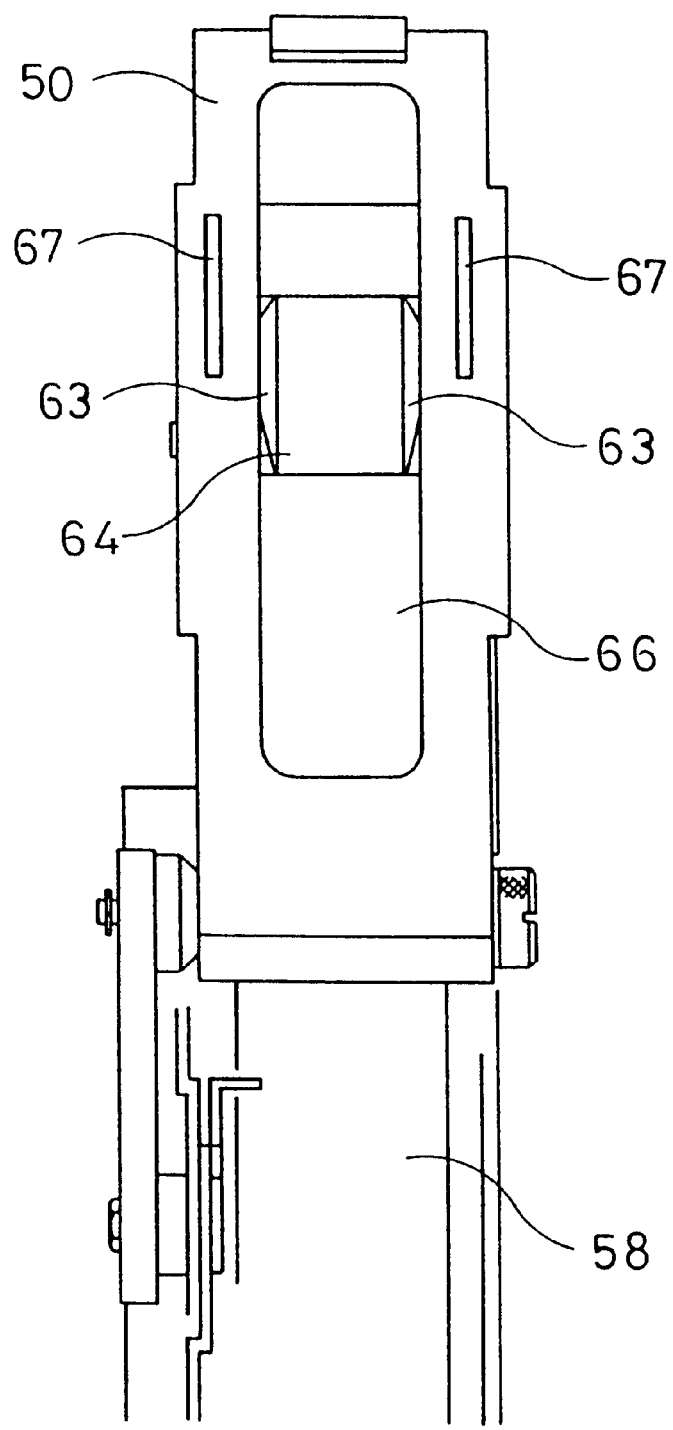
FIG. 16 is a plan view of the integral part of the part supply apparatus near a part removal position.
Figure 19:
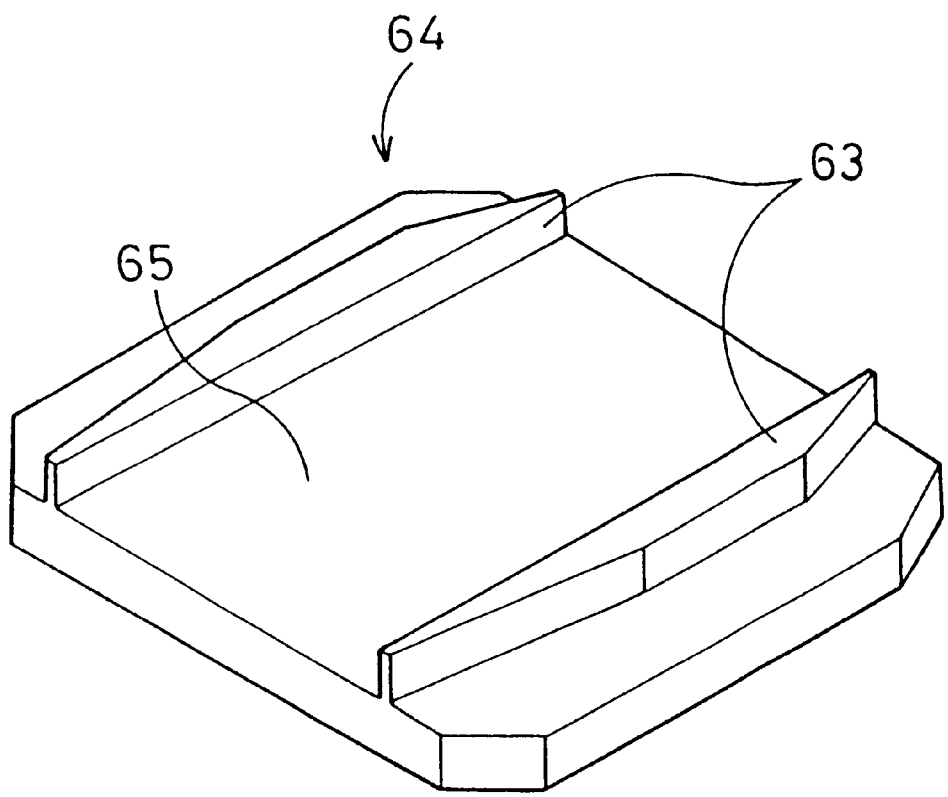
FIG. 19 is a perspective view of an engaging piece closing member in the part supply apparatus.

FIG. 16 is a plan view of an integral part near a part removal position 62. An engaging piece closing member 64 with a specified pair of guide protrusions 63 arranged in parallel with each other as shown in FIG. 19 is disposed within a specified range of the tape travelling section 58 including the part removal position. The engaging piece closing member 64 is provided in such a manner that the tape travelling surface 65 is as high as a tape travelling surface 66 of the tape travelling section 58. The tape guide 50 also has slits 67 for avoiding contact with the gear of the tape feed means 48 as shown in the figure.

Figure 18:
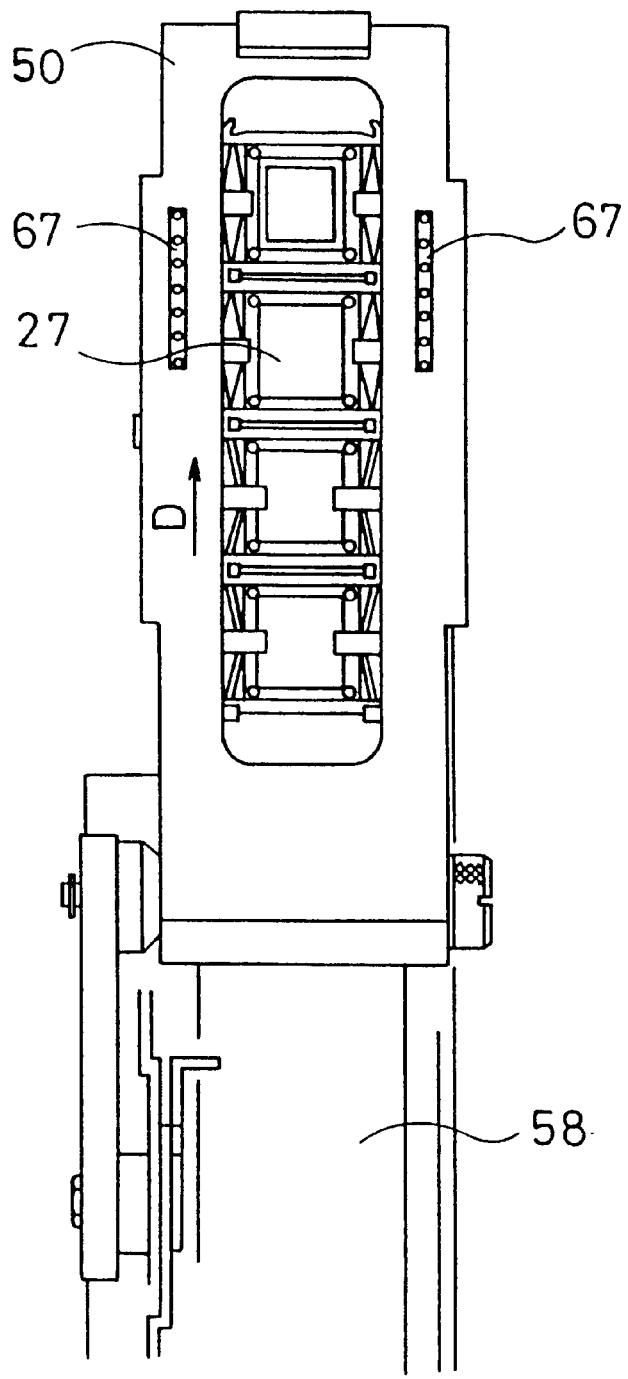
FIG. 18 is a plan view showing the environment of the part output position of the part supply apparatus when the part retainer is in use.

The operation during loading of the part retainer is described with reference to FIGS. 17 and 18.

The tape-like part retainer 1, drawn out from the feed reel 43, has its direction changed by the roller 42 so as to be approximately parallel with the tape travelling section 58, and pressed by the tape guide 50 against the tape travelling surface 65 near the part removal position 62. The gear of the tape feed means 48 is engaged with the feed holes 3 formed in the part retainer 1. The electronics mounting machine presses the feed lever 47 a specified amount in direction A to rotate the interlocked tape feed means 48 a specified amount in direction B, thereby feeding the part retainer 1 a specified amount in direction D. At this point, at the part removal position 62, the protrusions 10 on the rear surface of the part retainer 1 move along the inclined sides of the guide protrusions 63 and outward relative to the tape feed direction to open the engaging piece 7 in order to enable the retained part 27 to be removed from upward. After the part 27 has been removed at the part removal position 62, the part retainer 1 passes through the groove-like tape travelling space 61 formed below the tape traveling section 58, and is rewound around the reel 69. The winding operation of the winding means 57 is in synchronism with the tape feed operation of the tape feed means 48. In addition, since the winding means 57 is prevented from rotating in the opposite direction by a one-way clutch, the tape-like retainer 1 does not become loose during winding, and can be wound stably. As in the feed reel 43, the winding side has a reel presser section (not shown).

To replace the part retainer 1, the tape guide 50 is rotated upward around the supporting point 49 to release the engagement between the part retainer 1 and the gear of the tape feed means 48. The part retainer 1 is further moved in the direction shown by arrow D so as to become loose. The tape-like part retainer 1 can then be removed from the side of the apparatus (toward the reader in FIG. 17) with its connection between the feed reel 43 and the winding reel 69 maintained. Replacement is thus easy.

Although this embodiment has been shown in conjunction with the-formation of the groove-like tape travelling space 61 for enabling the part retainer 1 to be replaced from the side of the apparatus, this invention is not limited to the groove-like space 61 and only requires a space through which the part retainer 1 can travel to be provided on the tape travelling surface, the tape guide 50 to be rotated upward around the supporting point 49, and a gap to be provided between the tape guide 50 and the tape travelling surface such that the part retainer 1 can be removed therefrom.

In addition, this invention maintains a specified distance between the tip curved surface 70 of the tape guide 50 and the tape feed means 48, removal operation is easy when the part retainer is removed from the winding means 57 during replacement of the part retainer.

This part supply apparatus can be applied to a part retainer 1 with a different housing pitch by replacing the engaging piece closing member 64.

We claim:

1. A part retainer for holding a part, comprising:
   a retaining unit including opposed sidewalls which define a housing space, the housing space for holding a part therein;
   an engaging piece movable between a stable, stopped withdrawing position and a stable, stopped protruding position;
   a link piece extending between each one of the sidewalls and said engaging piece;
   a self hinge for connecting said link piece with said engaging piece;
   a self hinge for connecting said link piece with said one of the sidewalls;
   said retaining unit including an engagement hole and an engagement protrusion for cooperating with an engagement protrusion and an engagement hole, respectively, of another retaining unit to thereby connect the two retaining units together; and
   means for locking said engagement protrusion in said engagement hole;
   wherein said link piece maintains its linear configuration in the withdrawing and protruding positions of said engaging piece;

wherein said engaging piece in the protruding position prevents a part from falling out of the housing space.

2. The part retainer of claim 1, wherein:
a pair of said link pieces extend between one of the sidewalls and said engaging piece.

3. The part retainer of claim 2, wherein:
said engaging piece comprises first and second side end portions;
a first one of said pair of said link pieces extends between a first one of the sidewalls and said first side end portion of said engaging piece; and
a second one of said pair of said link piece extends between a second one of the sidewalls and said second side end portion of said engaging piece.

4. The part retainer of claim 3, wherein:
said first and second link pieces are each connected to the first and second sidewalls, respectively, by a self hinge.

5. The part retainer of claim 1, wherein:
said engaging piece is integrally formed with one of the link pieces.

6. The part retainer of claim 1, wherein:
one of the link pieces comprises a generally curved supporting piece.

7. The part retainer of claim 1, wherein:
said engaging piece includes a protrusion for guiding said engaging piece between said withdrawing and protruding positions along a groove of a guide rail provided for moving said engaging piece therealong.

8. The part retainer of claim 7, wherein:
said protrusion is located above said engaging piece.

9. The part retainer of claim 7, wherein:
said protrusion is located below said engaging piece.

10. The part retainer of claim 1, wherein:
said retaining unit comprises opposed ends; and
said engaging piece is provided at one of the opposed ends of said retaining unit.

11. The part retainer of claim 10, wherein:
a plurality of said engaging pieces are provided, one at each opposed end of said retaining unit.

12. The part retainer of claim 1, wherein:
said engaging piece is located on one side of the housing space.

13. The part retainer of claim 1, wherein:
engaging pieces are located on two sides of the housing space.

14. The part retainer of claim 1, wherein:
said retaining unit comprises a material selected from the group consisting of polypropylene and polyethylene.

15. The part retainer of claim 14, wherein:
said retaining unit is injection molded.

16. A part retainer for holding a part, comprising:
a retaining unit including opposed sidewalls which define a housing space, the housing space for holding a part therein;
an engaging piece movable between a stable, stopped withdrawing position and a stable, stopped protruding position;
said engaging piece including a generally horizontally extending section connected to a generally vertically extending section;
a link piece extending between one of the sidewalls and said engaging piece;
a self hinge for connecting said link piece with said engaging piece;
a self hinge for connecting said link piece with said one of the sidewalls;
said retaining unit including an engagement hole and an engagement protrusion for cooperating with an engagement protrusion and an engagement hole, respectively, of another retaining unit to thereby connect the two retaining units together; and
means for locking said engagement protrusion in said engagement hole;
wherein said link piece maintains its linear configuration in the withdrawing and protruding positions of said engaging piece;
wherein said engaging piece in the protruding position prevents a part from falling out of the housing space.

17. The part retainer of claim 16, wherein:
a pair of said link pieces extend between said one of the sidewalls and said engaging piece.

18. The part retainer of claim 17, wherein:
said engaging piece comprises first and second side end portions;
a first one of said pair of said link pieces extends between a first one of the sidewalls and said first side end portion of said engaging piece; and
a second one of said pair of said link piece extends between a second one of the sidewalls and said second side end portion of said engaging piece.

19. The part retainer of claim 18, wherein:
said first and second link pieces are each connected to the first and second sidewalls, respectively, by a self hinge.

20. The part retainer of claim 18, wherein:
said engaging piece is integrally formed with one of said first and second link pieces.

21. The part retainer of claim 16, wherein:
said link piece comprises a generally curved supporting piece including first and second ends;
one of said first and second ends is connected to one of the sidewalls by a first self hinge; and
the other of said first and second ends is connected to a second one of the sidewalls by a second self-hinge.

22. The part retainer of claim 21, wherein:
said engaging piece is operably connected to said curved supporting piece between the first and second ends thereof.

23. The part retainer of claim 16, wherein:
said engaging piece includes a protrusion for guiding said engaging piece between said withdrawing and protruding positions along a groove of a guide rail provided for moving said engaging piece there along.

24. The part retainer of claim 23, wherein:
said protrusion is located above said engaging piece.

25. The part retainer of claim 23, wherein:
said protrusion is located below said engaging piece.

26. The part retainer of claim 16, wherein:
said retaining unit comprises opposed ends; and
said engaging piece is provided at one of the opposed ends of said retaining unit.

27. The part retainer of claim 26, wherein:
a plurality of said engaging pieces are provided, one at each opposed end of said retaining unit.

28. The part retainer of claim 16, wherein:
said engaging piece is located on one side of the housing space.

29. The part retainer of claim 16, wherein: engaging pieces are located on two sides of the housing space.

30. The part retainer of claim 16, wherein: said retaining unit comprises a material selected from the group consisting of polypropylene and polyethylene.

31. The part retainer of claim 30, wherein: said retaining unit is injection molded.

32. The part retainer of claim 16, wherein:
a link piece extends between each of the sidewalls and said engaging piece.

* * * * *

UNITED STATES PATENT AND TRADEMARK OFFICE
CERTIFICATE OF CORRECTION

PATENT NO. : 6,003,675
DATED : December 21, 1999
INVENTOR(S) : Yoshio MARUYAMA, Yoshinori WADA, Shinji KADORIKU, Oasmu YAMAZAKI, Osamu HIKITA, and Daisuke NAGANO It is certified that error appears in the above-identified patent and that said Letters Patent is hereby corrected as shown below:

On the title page: Item [30] Foreign Application Priority Data: change "Jan. 26, 1996" to --Jan. 29, 1996--.

Signed and Sealed this

Fourth Day of July, 2000

Attest:

Q. TODD DICKINSON

Attesting Officer

Director of Patents and Trademarks